United States Patent
Basol et al.

(10) Patent No.: US 7,172,497 B2
(45) Date of Patent: Feb. 6, 2007

(54) FABRICATION OF SEMICONDUCTOR INTERCONNECT STRUCTURES

(75) Inventors: Bulent M. Basol, Manhattan Beach, CA (US); Homayoun Talieh, San Jose, CA (US)

(73) Assignee: ASM Nutool, Inc., Phoenix, AZ (US)

( * ) Notice: Subject to any disclaimer, the term of this patent is extended or adjusted under 35 U.S.C. 154(b) by 148 days.

(21) Appl. No.: 10/264,726

(22) Filed: Oct. 3, 2002

(65) Prior Publication Data
US 2003/0032373 A1 Feb. 13, 2003

Related U.S. Application Data

(63) Continuation-in-part of application No. 09/795,687, filed on Feb. 27, 2001, now Pat. No. 6,953,392.

(60) Provisional application No. 60/261,263, filed on Jan. 16, 2001, provisional application No. 60/259,676, filed on Jan. 5, 2001.

(51) Int. Cl.
*B24B 1/00* (2006.01)
*B24B 7/22* (2006.01)
(52) U.S. Cl. .............................. 451/54; 451/59; 451/67
(58) Field of Classification Search ................. 451/36, 451/37, 41, 54, 57, 59, 63, 65, 66, 67, 331, 451/339; 156/345.12; 204/198, 241, 269, 204/270; 216/38, 88–90, 108, 109; 438/690–693
See application file for complete search history.

(56) References Cited

U.S. PATENT DOCUMENTS

| | | | |
|---|---|---|---|
| 5,620,578 A | 4/1997 | Hurwitt | |
| 5,679,059 A | 10/1997 | Nishi et al. | |
| 5,821,168 A * | 10/1998 | Jain | 438/692 |
| 5,826,129 A | 10/1998 | Hasebe et al. | |
| 5,827,110 A | 10/1998 | Yajima et al. | |
| 5,830,045 A | 11/1998 | Togawa et al. | |
| 5,885,138 A | 3/1999 | Okumura et al. | |
| 5,954,072 A | 9/1999 | Matusita | |
| 5,972,110 A | 10/1999 | Akimoto | |
| 6,059,637 A * | 5/2000 | Pasch et al. | 451/41 |

(Continued)

FOREIGN PATENT DOCUMENTS

EP 0978867 2/2000

(Continued)

OTHER PUBLICATIONS

U.S. Appl. No. 09/671,800; filed Sep. 28, 2000; Basol et al. (ASMNUT.043A).

*Primary Examiner*—Timothy V. Eley
(74) *Attorney, Agent, or Firm*—Knobbe Martens Olson & Bear LLP

(57) ABSTRACT

A system and a method of forming copper interconnect structures in a surface of a wafer is provided. The method includes a step of performing a planar electroplating process in an electrochemical mechanical deposition station for filling copper material into a plurality of cavities formed in the surface of the wafer. The electroplating continues until a planar layer of copper with a predetermined thickness is formed on the surface of the wafer. In a following chemical mechanical polishing step the planar layer is removed until the copper remains in the cavities, insulated from one another by exposed regions of the dielectric layer.

16 Claims, 4 Drawing Sheets

U.S. PATENT DOCUMENTS

| | | |
|---|---|---|
| 6,110,011 A | 8/2000 | Somekh et al. |
| 6,122,566 A | 9/2000 | Nguyen et al. |
| 6,132,289 A | 10/2000 | Labunsky et al. |
| 6,136,163 A | 10/2000 | Cheung et al. |
| 6,176,992 B1 | 1/2001 | Talieh |
| 6,224,638 B1 | 5/2001 | Jevtic et al. |
| 6,251,759 B1 | 6/2001 | Guo et al. |
| 6,346,479 B1 * | 2/2002 | Woo et al. .................. 438/687 |
| 6,355,153 B1 * | 3/2002 | Uzoh et al. ................... 205/87 |
| 6,368,880 B2 | 4/2002 | Singhvi et al. |
| 6,409,576 B1 | 6/2002 | Oguri et al. |
| 6,409,904 B1 | 6/2002 | Uzoh et al. |
| 6,413,869 B1 * | 7/2002 | Achuthan et al. ........... 438/690 |
| 6,451,697 B1 * | 9/2002 | Sun et al. ................... 438/691 |
| 6,461,225 B1 * | 10/2002 | Misra et al. .................. 451/41 |
| 6,468,022 B1 | 10/2002 | Whitcomb |
| 6,494,985 B1 | 12/2002 | Sotozaki et al. |
| 6,578,853 B1 | 6/2003 | Treur et al. |
| 6,613,200 B2 | 9/2003 | Li et al. |
| 6,656,842 B2 * | 12/2003 | Li et al. ...................... 438/691 |
| 6,736,929 B2 | 5/2004 | Komandur et al. |
| 6,857,838 B2 | 2/2005 | Kuroda |
| 2002/0031985 A1 * | 3/2002 | Wang et al. ................... 451/41 |
| 2002/0153256 A1 * | 10/2002 | Uzoh et al. ................. 205/117 |
| 2004/0007478 A1 * | 1/2004 | Basol et al. ................. 205/668 |
| 2004/0052930 A1 | 3/2004 | Basol et al. |

FOREIGN PATENT DOCUMENTS

| | | |
|---|---|---|
| EP | 1037263 | 9/2000 |
| WO | WO 200229861 | 4/2002 |

\* cited by examiner

FABRICATION OF SEMICONDUCTOR INTERCONNECT STRUCTURES

REFERENCE TO RELATED APPLICATIONS

This Application is a continuation in part of U.S. patent application Ser. No. 09/795,687 filed Feb. 27, 2001, now U.S. Pat. No. 6,953,392 claiming priority to Prov. No. 60/261,263 filed Jan. 16, 2001 and Prov. No. 60/259,676 filed Jan. 5, 2001, all incorporated herein by reference.

FIELD

The present invention relates to manufacture of semiconductor integrated circuits and more particularly to a method of electrochemical mechanical deposition and chemical mechanical polishing of conductive layers.

BACKGROUND

Conventional semiconductor devices generally include a semiconductor substrate, usually a silicon substrate, and a plurality of sequentially formed dielectric interlayers such as silicon dioxide and conductive paths or interconnects made of conductive materials. Copper and copper alloys have recently received considerable attention as interconnect materials because of their superior electromigration and low resistivity characteristics. The interconnects are usually formed by filling copper in features or cavities etched into the dielectric interlayers by a metallization process. The preferred method of copper metallization process is electroplating. In an integrated circuit, multiple levels of interconnect networks laterally extend with respect to the substrate surface. Interconnects formed in sequential interlayers can be electrically connected using vias or contacts.

In a typical process, first an insulating interlayer is formed on the semiconductor substrate. Patterning and etching processes are performed to form features such as trenches and vias in the insulating layer. Typically the width of the trenches is larger than the width of the vias. Then, copper is electroplated to fill the features. Once the plating is over, a chemical mechanical polishing (CMP) step is conducted to remove the excess copper layer and other conductive layers that are above the top surface of the substrate to form the interconnect structure. These processes are repeated multiple times to manufacture multi layer interconnects.

An exemplary prior art process can be briefly described with the help of FIGS. 1A and 1B. FIG. 1A shows a substrate 8 which is processed to form an exemplary dual damascene structure shown in FIG. 1B. In this structure, a via 10 and a trench 12 are formed in an isolating layer 14 on the substrate 8, and filled with copper 16 through electroplating process. Conventionally, after patterning and etching which form the cavities such as vias and trenches, the isolating layer 14 is first coated with a barrier layer 18, for example, a Ta/TaN composite layer. The barrier layer 18 coats the insulating layer to ensure good adhesion and acts as a barrier material to prevent diffusion of the copper into the insulating layers and into the semiconductor devices. Next, a seed layer (not shown), which is often a copper layer, is deposited on the barrier layer. The seed layer forms a conductive material base for copper crystal growth during the subsequent copper deposition. As the copper film is electroplated, the copper 16 quickly fills the small via 10 but coats the wide trench and the surface in a conformal manner. When the deposition process is continued, the trench is also filled with copper, but with a step 's' and a thick copper layer 't'. Thick copper on the surface presents a problem during CMP step that is expensive and time consuming. As shown in FIG. 1B, during the CMP removal of the thick copper layer on the trench 12 and the barrier layer 18 on the top surface, a non-planar 20 surface may be formed on the remaining surface of the copper layer. The non-planar surface may form due to the difference in polishing rate between the barrier layer and the copper. The non-planar surface 20, or so called "dishing effect", adversely affects the quality of the subsequently deposited layers.

Some prior art processes attempt to minimize or eliminate the dishing effect by employing multiple polishing steps with different slurries and polishing pads. For example, in one particular prior art process, at a first CMP process step the bulk copper layer on the substrate is removed down to a thickness that is over the barrier layer. The first step is performed in a first CMP station with a polishing pad that has no abrasive particles. A second step is performed in a second CMP station that has a pad with fixed abrasives to expose a portion of the barrier layer that overlies the insulating layer. In a third step, the portion of the barrier layer that overlies the insulating layer is removed using a pad that has no fixed particles. The third step is performed in a third CMP station.

In such prior art processes, multiple polishing steps increase the production time and the production cost. To this end, there is a need for an alternative method of planarizing plated substrates.

SUMMARY

The present invention provides a method of and system for plating a conductor and then chemically mechanically polishing the plated conductor in an advantageous manner that increases throughput and reduces defects. In particular, the conductor is plated using an electrochemical mechanical deposition (ECMD) process, and thereafter subjected to chemical mechanical polishing (CMP).

An exemplary embodiment system and a method of forming copper interconnect structures in a surface of a wafer is provided. The method includes a step of performing a planar electroplating process in an electrochemical mechanical deposition station for filling copper material into a plurality of cavities formed in the in the insulator layer or dielectric layer on the surface of the wafer. The electroplating continues until a planar layer of copper with a predetermined thickness is formed on the surface of the wafer. In a following chemical mechanical polishing step the planar layer is removed until the copper remains only in the cavities, isolated from one another by the dielectric layer.

DETAILED DESCRIPTION

Figure 1A:
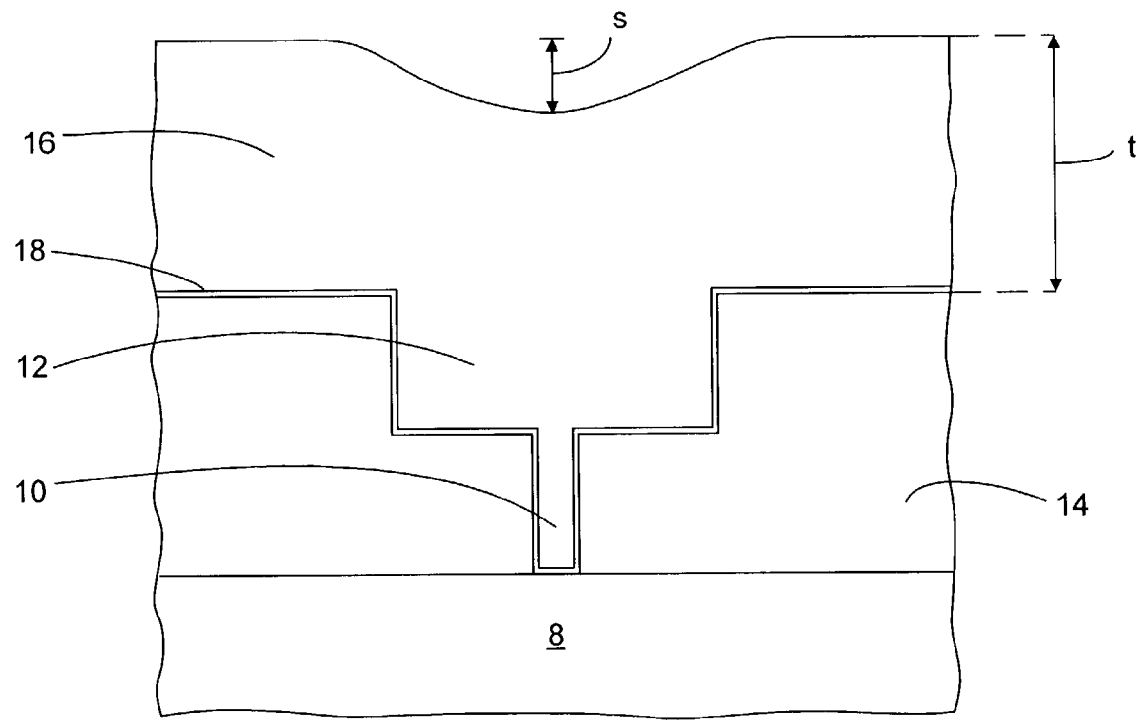
FIG. 1A is a schematic illustration of a prior art dual damascene structure having an electrodeposited copper overburden layer.
Figure 1B:
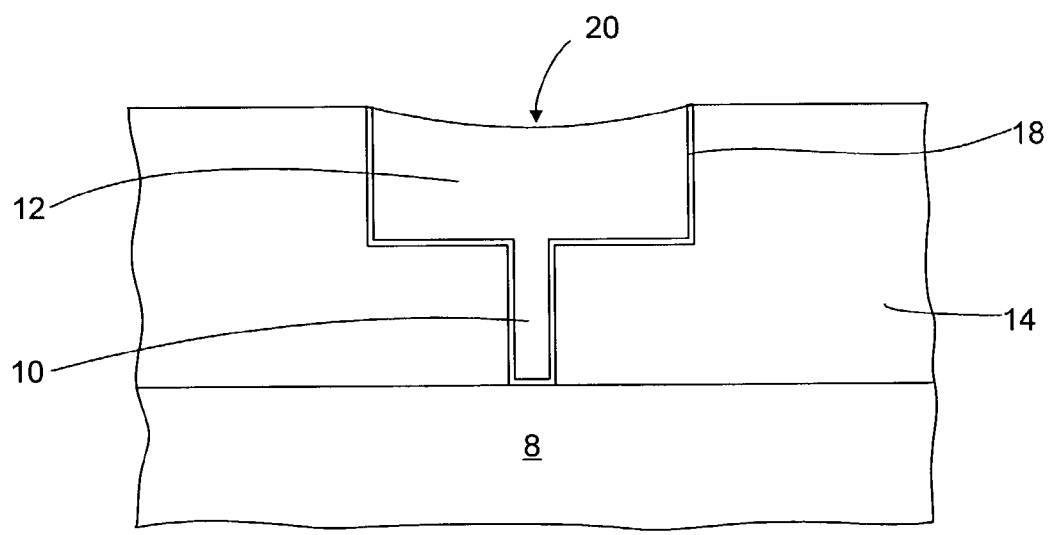
FIG. 1B is a schematic illustration of the prior art structure shown in FIG. 1A wherein the copper overburden and the barrier layer are polished using CMP resulting in dishing in the copper layer.

As will be described below, the present invention provides a method and a system for manufacturing interconnects for semiconductor integrated circuits. In one embodiment, the present invention employs a planar deposition process, such as electrochemical mechanical deposition (ECMD) process and chemical mechanical polishing process (CMP) to form copper interconnects. In this embodiment, for example, a thin planar copper layer is initially formed by an ECMD process step which is subsequently removed by carrying out two separate CMP process steps to produce final interconnect structure. In another embodiment, an initial ECMD process step is used to form a planar layer that is thinner than the layer formed in the first embodiment. This thin planar layer along with the barrier are removed using a single CMP step to form the final interconnect structure.

Descriptions of various ECMD deposition methods and apparatuses that provide for planar deposition of a conductor can be found in the following patents and pending applications, all commonly owned by the assignee of the present invention. U.S. Pat. No. 6,176,992, entitled "Method and Apparatus for Electrochemical Mechanical Deposition." U.S. application Ser. No. 09/740,701, now U.S. Patent Publication No. 2002/0074230, entitled "Plating Method and Apparatus that Creates a Differential Between Additive Disposed on a Top Surface and a Cavity Surface of a Workpiece Using an External Influence," filed on Dec. 18, 2001. A system that uses ECMD, and which can be adapted to obtain the systems described herein and perform the processes described herein is discussed in U.S. Utility application Ser. No. 09/795,687, now U.S. Patent Publication No. 2002/0088543, entitled "Integrated System for Processing Semiconductor Wafers" filed on Feb. 27, 2001 (incorporated herein by reference above) and which is based on priority provisional applications No. 60/259,676 filed Jan. 5, 2001 and No. 60/261,263 filed Jan. 16, 2001. As described in those references, the ECMD uniformly fills holes (or vias) and trenches on a surface of a wafer with a conductive material while mechanically maintaining the planarity of the surface with a pad.

The CMP process conventionally involves pressing a semiconductor wafer or other such substrate against a moving polishing surface that is wetted with a chemical reactive abrasive slurry. The slurries are usually either basic or acidic and generally contain alumina, ceria, silica or other hard ceramic particles. The polishing surface is typically a planar pad made of polymeric materials well known in the art of CMP. The pad itself may also be an abrasive pad. During a CMP process a wafer carrier with a wafer to be processed is placed on a CMP pad and pressed against it. The pad, which may be an abrasive pad, may be moved laterally as a linear belt or may be rotated. The process is performed by moving the wafer against the pad or the linear belt in a CMP slurry solution flowing between the pad and the wafer surface. The slurry may be any of the known CMP slurries in the art, and may be flowed over the pad or may be flowed through the pad if the pad is porous in the latter case.

Figure 2:
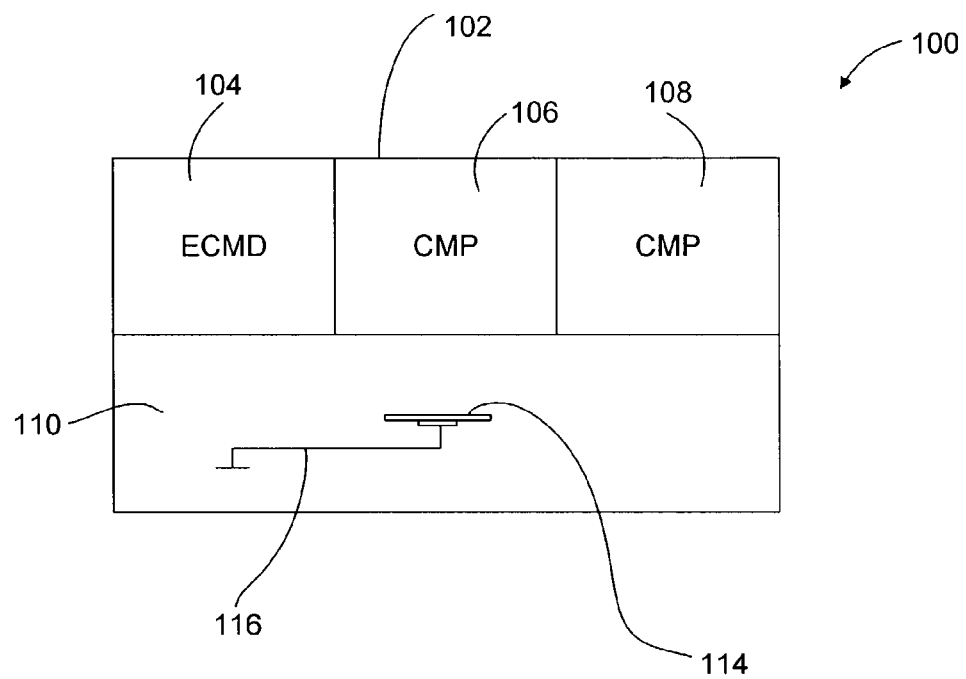
FIG. 2 is a schematic view of an embodiment of an integrated tool to perform the present invention by employing ECMD and CMP modules.

Reference will now be made to the drawings wherein like numerals refer to like parts throughout. FIG. 2 shows a first system 100 of the present invention. The first system 100 comprises a processing section 102 comprising a planar conductor deposition station 014 such as an ECMD copper process station as well as a first CMP process station 106 and a second CMP process station 108. A buffer section 110 is in communication with the processing section 102 through a robot 116 or robot arm. Although, in this example, the stations 104–108 are shown as an integrated part of the first system 100, they may be individual stations that are located separately. In this embodiment, the stations 104–108 may preferably be vertically stacked chambers including a lower process chamber (ECMD or CMP chamber) and a top rinsing and drying chamber. One such exemplary vertical chamber design and operation is disclosed in U.S. Pat. No. 6,352,623, entitled "Vertically Configured Chamber Used for Multiple Processes," filed Dec. 17, 1999, commonly owned by the assignee of the present invention. In operation, a wafer 114 or work piece to be plated may be picked up from a load unload section (not shown) of the system by the robot 116 which is located in the buffer section 110. The wafer 114 can then be transferred to the ECMD station 104 in the processing section 102 to initiate the process. The process stations 104–108 can be either adapted to process 200 or 300 millimeter wafers. The system 100 may also have an anneal chamber (not shown) to anneal the planar deposited substrates before or after the CMP processes, or before and after the CMP process.

Figure 3A:
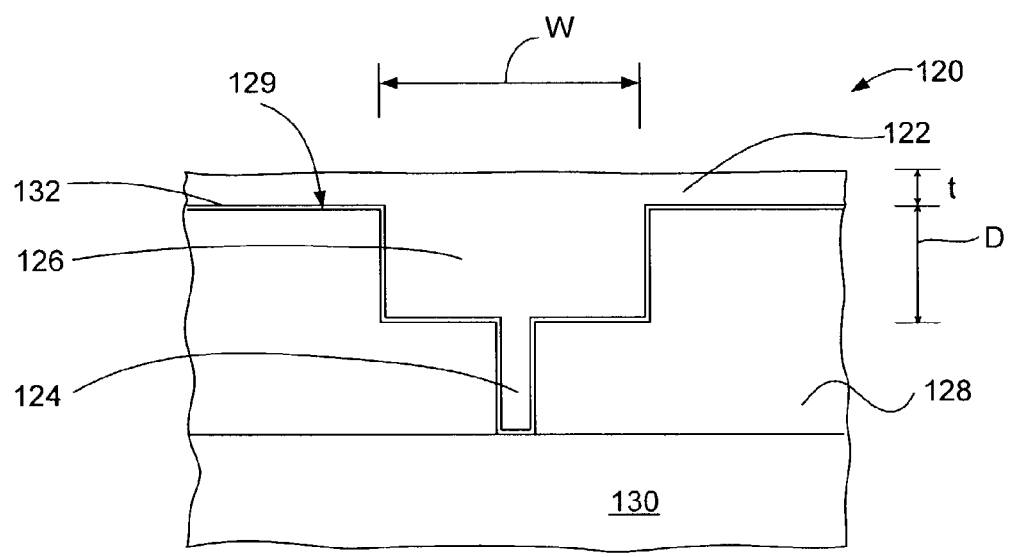
FIG. 3A is a schematic view of a dual damascene structure having a planar copper layer, wherein the planar copper layer has been electroplated using the system shown in FIG. 2.
Figure 3B:
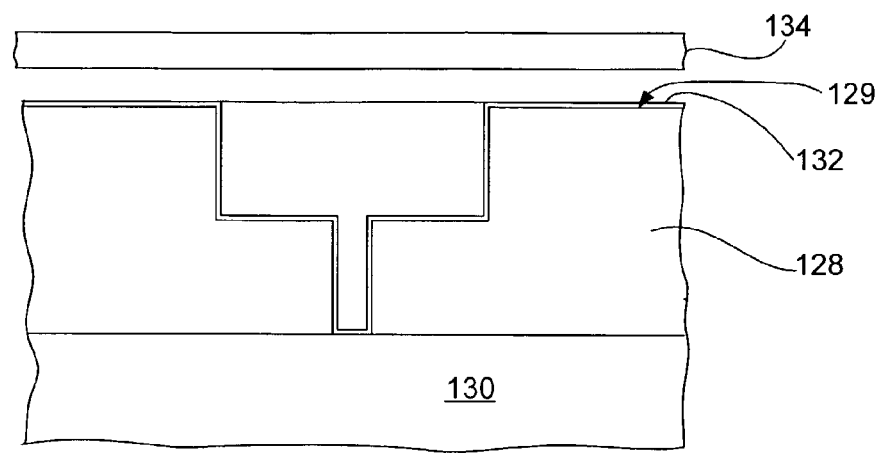
FIG. 3B is a schematic view of the structure shown in FIG. 3A, wherein the planar copper layer has been polished using the system shown in FIG. 2.
Figure 3C:
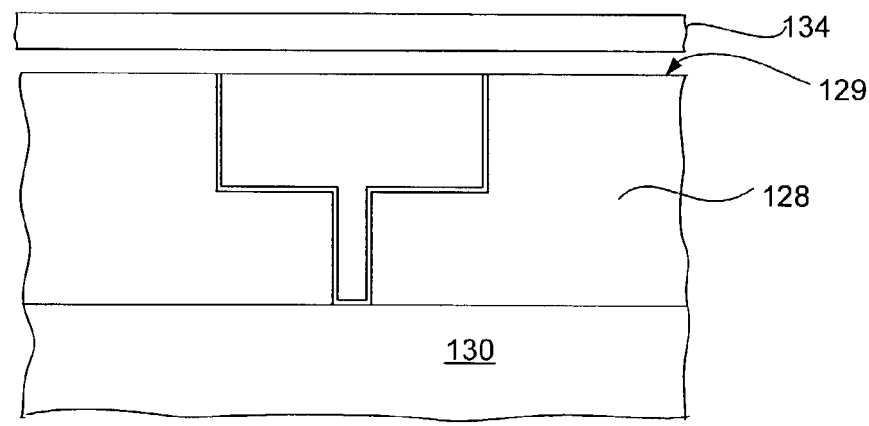
FIG. 3C is a schematic view of the structure shown in FIG. 3B, wherein a barrier layer has been removed from the field regions.

FIGS. 3A–3C are schematic cross-sectional views exemplifying the process of the present invention to form a copper interconnect using the method of the present invention and the system shown in FIG. 2. Although copper is used as an example material that is deposited and/or removed herein, the present invention may be used when depositing or removing other conductors, for example Ni, Pd, Pt, Au, Pb, Sn, Ag, Co and their alloys. In this example an exemplary dual damascene structure will be formed in accordance with the principles of the present invention. FIG. 3A shows a semiconductor substrate 120 having a planar copper layer 122 formed in a first step of the present invention. In the ECMD station 104 shown in FIG. 2, the planar layer 122 is electroplated into a via 124 and a trench 126 which are patterned and etched into an insulating layer 128. The insulating layer 128 has a top surface 129 and is formed on a semiconductor wafer 130. A conducting layer 132 conformally coats the via 124, the trench 126 and the top surface 129 of insulating layer 128. The conducting layer 132 comprises a barrier layer. The conducting 132 layer may also comprise a copper seed layer (not shown) which is deposited on the barrier layer 132. The thickness of a portion of the flat copper layer 122 that overlies the top surface 129 of the insulator 128 is related to the depth of the largest feature, i.e., the feature with the largest width, to be filled on the substrate 130, which is in this example the trench 126. If the width of the trench 126 which is denoted by 'W' is the largest on the substrate, the thickness 't' of the flat copper portion that overlies the top surface 129 can be equal to or less than 0.75

D, where 'D' is the depth of the trench. However, it is understood that if there is a larger, i.e., wider feature, on the entire wafer surface, thickness t will be a function of the depth of that larger feature, i.e., it would be less than or equal to about three quarters of the depth of that largest feature. It should be noted that in the prior art process (see FIG. 1A), the thickness of the copper overburden is larger than D, i.e., t>D. Such thin and flat copper layer produced by the planar deposition techniques such as ECMD process advantageously eliminates the use of a conventional step of removing overburden or the excess copper from the surface of the substrate. The ECMD station 104 then rinses the substrate and sends to the first CMP station 106.

As shown in FIG. 3B, in a second step of the present invention, a CMP process is performed in the first CMP station to polish away the excess flat copper layer, in a planar manner, that overlies barrier layer on the top surface 129 of the insulating layer 128. The second step can preferably be performed using a fixed abrasive pad 134 without an abrasive slurry. The fixed abrasive pad 134 selectively removes the copper layer 122 down to the barrier layer. The first CMP station 106 then rinses the substrate and transfers to the second CMP station 108.

As shown in FIG. 3C, at the final polishing step that is performed in the second CMP station, the barrier layer 132 overlying the top surface 129 of the insulating layer 128 is removed with a slurry based CMP process using a non-abrasive pad 136. Any remaining portions of copper is also removed during this step. Removal of copper and barrier layers using different polishing pad and slurries is disclosed in the co-pending U.S. Provisional Patent Application No. 60/365,001, entitled "Method and Apparats for Integrated Chemical Mechanical Polishing of Copper and Barrier Layers," filed Mar. 13, 2002, commonly owned by the assignee of the present invention.

Figure 4:
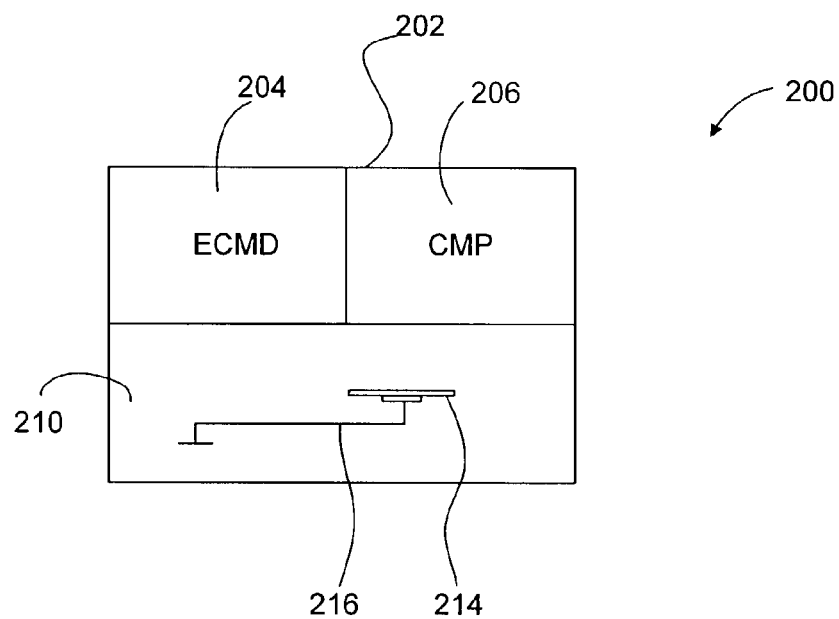
FIG. 4 is a schematic view of a second embodiment of an integrated tool to perform the present invention by employing ECMD and CMP modules.

FIG. 4 shows a second system 200 of the present invention. The second system 200 comprises a processing section 202 comprising an ECMD process station 204 and a CMP process station 206. A buffer section 210 is connected to the processing section 202. Although, in this example, the stations 204 and 206 are shown as an integrated part of the second system 200, they may be individual stations that are located separately. In this embodiment, the stations 204 and 206 may preferably be vertically stacked chambers including a lower process chamber (ECMD or CMP chamber) and a top rinsing and drying chamber. One such exemplary vertical chamber design and operation is disclosed in the co-pending U.S. Pat. No. 6,352,623, entitled "Vertically Configured Chamber Used for Multiple Processes," filed Dec. 17, 1999, commonly owned by the assignee of the present invention. In operation, a wafer 214 or work piece to be plated may be picked up from a load/unload section (not shown) of the system by a robot 216 which is located in the buffer section 212. The wafer 214 can then be transferred to the ECMD station in the processing section 202 to initiate the process. The process stations 204 and 206 can be either adapted to process 200 or 300 millimeter wafers. The system 200 may also have an anneal chamber (not shown) to anneal substrates processed in ECMD chamber prior to or after the CMP process, or before and after the CMP process.

Figure 5A:
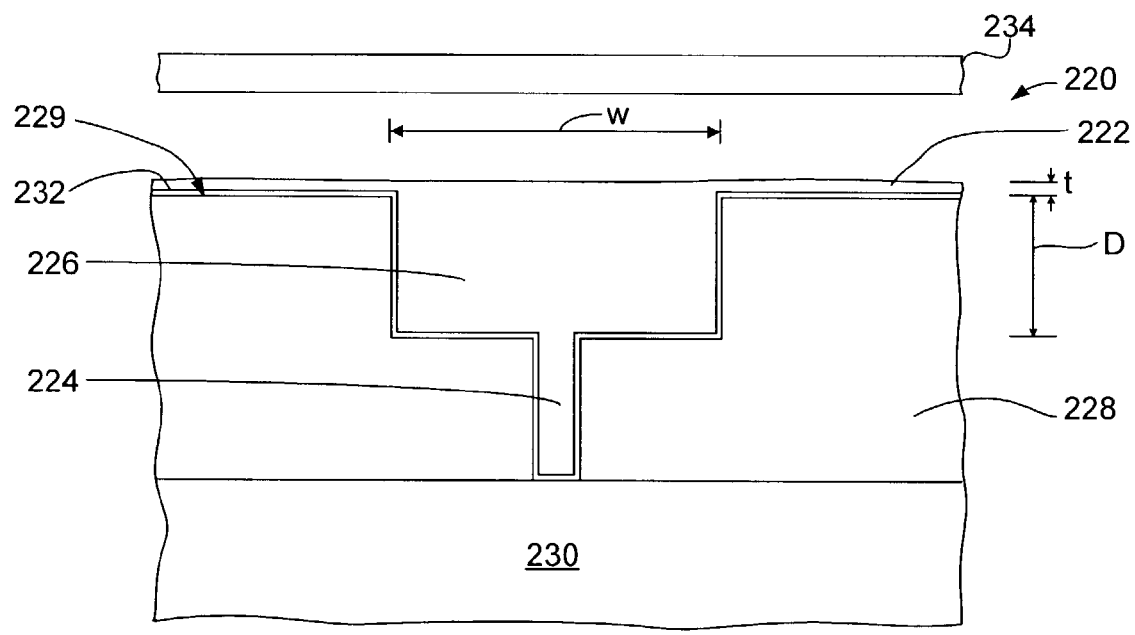
FIG. 5A is a schematic view of a dual damascene structure having a planar copper layer, wherein the planar copper layer has been electroplated using the system shown in FIG. 4.
Figure 5B:
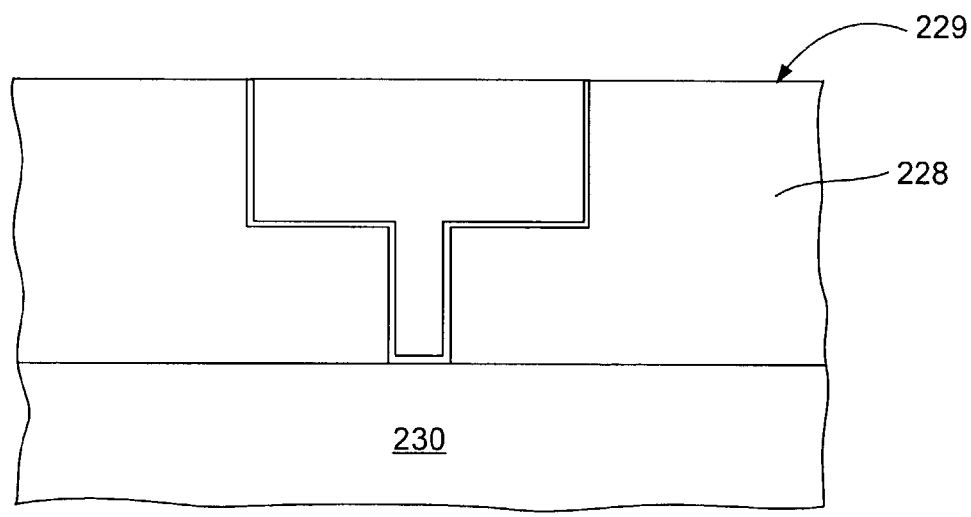
FIG. 5B is a schematic view of the structure shown in FIG. 3A, wherein the both planar copper layer and the barrier layer on the field regions have been polished using the system shown in FIG. 4.

FIGS. 5A and 5B are schematic cross-sectional views exemplifying the process of the present invention to form a copper interconnect using the system shown in FIG. 4. In this embodiment a dual damascene structure will be formed in accordance with the principles of the present invention.

FIG. 5A shows a semiconductor substrate having a thin planar copper layer 222 formed in a first step of the present invention. In the ECMD station 204 shown in FIG. 4, the planar layer is electroplated into a via 224 and a trench 226 which are patterned and etched into an insulating layer 228. The insulating layer 228 has a top surface 229 and is formed on a semiconductor wafer 230. A barrier layer 232 coats the via 224, the trench 226 and the top surface 229 of insulating layer 228. In this embodiment, the thickness of a portion of the flat copper layer 222 that overlies the top surface 229 of the insulator 228 is less than or equal to 2000 Angstroms, preferably, less than 1000 Angstroms. Such thin and flat copper layer produced by the ECMD process advantageously eliminates the use of a conventional steps of removing overburden or the excess copper and the barrier layer from the surface of the substrate. The ECMD station 204 then rinses the substrate and sends to the CMP station 206 (see FIG. 4).

As shown in FIG. 5B, in the final step of the present invention, a CMP process is performed to polish away the excess flat copper layer and the barrier layer, in a single polishing step, that overlies barrier layer on the top surface 129 of the insulating layer 128. This step can be performed using a pad 234 with an abrasive slurry or an abrasive pad with non-abrasive slurry. The pad 234 removes the copper layer 222 and the barrier layer 232 down to the top surface 229 of the interconnect 228. Ultimately, a metallic interconnect is formed, thereby forming a complete dual damascene structure. A non-selective slurry may also be used in this step to remove a small thickness of the insulator or dielectric layer, thereby minimizing dishing effects.

It should be noted that although the present invention is described through the use of the ECMD process, it is also applicable to any planar deposition process that can yield thin layers.

Although, exemplary system comprising specific number of process modules have been illustrated and described above, it is understood that the above described systems may include more or less number of ECMD and CMP process modules depending upon throughput considerations. Further, in this application, the systems are shown schematically, thus, the process modules within the systems may be varied without changing the process results of the invention.

Although various preferred embodiments and the best mode have been described in detail above, those skilled in the art will readily appreciate that many modifications of the exemplary embodiment are possible without materially departing from the novel teachings and advantages of this invention.

The invention claimed is:

1. A method of fabricating conductive structures in a plurality of cavities formed in a surface of a substrate, wherein the surface and the cavities are coated with a conducting film, and wherein the conducting film comprises a barrier layer, the method comprising the steps of:
   performing in a first station an electrochemical mechanical deposition (ECMD) process for filling a conductive material into the plurality of cavities until a planar layer of conductive material with a predetermined thickness is formed on the surface of the substrate;
   moving the substrate to a second station after performing the ECMD process; and
   applying a chemical mechanical polishing process in the second station to polish the conductive material and the conducting film off the surface of the substrate.

2. The method of claim 1, wherein the applying step comprises a first chemical mechanical process step to remove the planar layer until the barrier layer is exposed on the surface and the conductive material remains in the cavities.

3. The method of claim 2, wherein the applying step further comprises a second chemical mechanical process step to remove the barrier layer from the surface while leaving the conductive material in the cavities, isolated from one another, the second chemical mechanical process step being performed after the first chemical mechanical process step.

4. The method of claim 3, wherein the second chemical mechanical polishing process step uses a non-abrasive polishing pad and a polishing slurry.

5. The method of claim 2, wherein the planar layer has a thickness that is less than ¾ of a depth of the cavities.

6. The method of claim 2, wherein the first chemical mechanical polishing process step uses a fixed abrasive polishing pad and a polishing slurry.

7. The method of claim 1, wherein the applying step removes the planar conductive layer and the barrier layer on the surface of the substrate in a single step so that the conductive material remains in the cavities, isolated from one another.

8. The method of claim 7, wherein the predetermined thickness of the planar layer is less than 2000 Angstroms.

9. The method of claim 7, further comprising polishing the surface of the substrate so as to remove a predetermined thickness of an insulator layer on the substrate surface.

10. The method of claim 1, further comprising performing an anneal step for annealing the conductive material prior to chemical mechanical polishing.

11. The method of claim 1, further comprising performing an anneal step for annealing the conductive material prior to chemical mechanical polishing and then subsequent to chemical mechanical polishing.

12. The method of claim 1, further comprising performing an anneal step for annealing the conductive material subsequent to chemical mechanical polishing.

13. The method of claim 1, wherein performing in a first station an electrochemical mechanical deposition (ECMD) process comprises using a pad to maintain the planarity of the surface.

14. A method of fabricating conductive structures in a plurality of cavities formed in a surface of a substrate, wherein the surface and the cavities are coated with a conducting film, and wherein the conducting film comprises a barrier layer, the method comprising the steps of:

performing an electrochemical mechanical deposition (ECMD) process for filling a conductive material into the plurality of cavities until a planar layer of conductive material with a predetermined thickness is formed on the surface of the substrate; and applying a two step chemical mechanical polishing process to polish the conductive material and the conducting film off the surface of the substrate, wherein a first step of the polishing process removes the conductive material on the surface of the substrate and then a second step of the polishing process removes the barrier layer on the surface so that the conductive material remains in the cavities, isolated from one another.

15. A method of fabricating conductive structures in a plurality of cavities formed in a surface of a substrate, wherein the surface and the cavities are coated with a conducting film, and wherein the conducting film comprises a barrier layer, the method comprising the steps of:

performing in a first station an electrochemical mechanical deposition process for filling a conductive material into the plurality of cavities until a planar layer of conductive material with a predetermined thickness is formed on the surface of the substrate;

moving the substrate into a second station after performing the electrochemical mechanical deposition process; and applying in a second station a single step chemical mechanical polishing process to polish the conductive material and the conductive film off the surface of the substrate so that the conductive material remains in the cavities, isolated from one another.

16. A method of manufacturing a semiconductor device comprising:

electroplating in a first station a planar layer of conductive material onto a substrate using an electrochemical mechanical deposition (ECMD) process;

moving the substrate into a second station after electroplating; and performing in a second station a chemical mechanical process to polish the conductive layer.

* * * * *